US007015838B1

(12) United States Patent
Groen et al.

(10) Patent No.: US 7,015,838 B1
(45) Date of Patent: *Mar. 21, 2006

(54) PROGRAMMABLE SERIALIZING DATA PATH

(75) Inventors: Eric D. Groen, Ankeny, IA (US); Charles W. Boecker, Ames, IA (US)

(73) Assignee: Xilinx, Inc., San Jose, CA (US)

( * ) Notice: Subject to any disclaimer, the term of this patent is extended or adjusted under 35 U.S.C. 154(b) by 126 days.

This patent is subject to a terminal disclaimer.

(21) Appl. No.: 10/659,973

(22) Filed: Sep. 11, 2003

(51) Int. Cl.
*H03M 9/00* (2006.01)
*G06F 13/12* (2006.01)
*G06F 13/38* (2006.01)

(52) U.S. Cl. ........................ 341/100; 710/71
(58) Field of Classification Search ............... 341/100, 341/101; 257/241; 327/407; 370/284, 517, 370/536; 710/71; 712/39
See application file for complete search history.

(56) References Cited

U.S. PATENT DOCUMENTS

| 4,236,830 | A | * | 12/1980 | Schlig ..................... 257/241 |
| 4,445,215 | A | * | 4/1984 | Svendsen ................. 370/517 |
| 5,247,652 | A | * | 9/1993 | Uda ........................ 710/71 |
| 5,675,584 | A | * | 10/1997 | Jeong ...................... 370/284 |
| 5,726,651 | A | * | 3/1998 | Belot ...................... 341/101 |
| 5,726,990 | A | * | 3/1998 | Shimada et al. .......... 370/536 |
| 5,808,571 | A | * | 9/1998 | Kuwata et al. ........... 341/100 |
| 6,169,500 | B1 | * | 1/2001 | Eriksson et al. .......... 341/100 |
| 6,335,696 | B1 | * | 1/2002 | Aoyagi et al. ............ 341/100 |
| 6,336,181 | B1 | * | 1/2002 | Fuzisawa et al. .......... 712/39 |
| 6,701,396 | B1 | * | 3/2004 | Okajima ................... 710/71 |
| 6,710,726 | B1 | * | 3/2004 | Kim et al. ................ 341/100 |
| 6,788,127 | B1 | * | 9/2004 | Sato ....................... 327/407 |
| 6,812,870 | B1 | | 11/2004 | Kryzak et al. |
| 6,870,390 | B1 | | 3/2005 | Groen et al. |
| 6,908,340 | B1 | | 6/2005 | Shafer |

OTHER PUBLICATIONS

U.S. Appl. No. 10/660,234, filed Sep. 11, 2003, Boecker.
U.S. Appl. No. 10/660,449, filed Sep. 11, 2003, Cory et al.
U.S. Appl. No. 10/660,062, filed Sep. 11, 2003, Groen et al.
U.S. Appl. No. 10/659,803, filed Sep. 11, 2003, Black et al.
U.S. Appl. No. 10/659,819, filed Sep. 11, 2003, Groen et al.
U.S. Appl. No. 10/659,971, filed Sep. 11, 2003, Boecker et al.
U.S. Appl. No. 10/660,254, filed Sep. 11, 2003, Groen et al.
U.S. Appl. No. 10/661,016, filed Sep. 11, 2003, Groen et al.

(Continued)

*Primary Examiner*—Patrick Wamsley
(74) *Attorney, Agent, or Firm*—Timothy W. Markison; Justin Liu

(57) ABSTRACT

A programmable serial data path includes a programmable timing circuit and a parallel to serial module. The programmable timing circuit is operably coupled to generate a first plurality of timing signals when width of parallel input data is of a first multiple and to generate a second plurality of timing signals when the width of the parallel input data is of a second multiple. The parallel to serial module is operably coupled to convert the parallel input data into serial output data based on the first or second plurality of timing signals.

19 Claims, 11 Drawing Sheets

OTHER PUBLICATIONS

U.S. Appl. No. 10/659,979, filed Sep. 11, 2003, Kryzak et al.
U.S. Appl. No. 10/659,974, filed Sep. 11, 2003, Kryzak et al.
U.S. Appl. No. 10/660,159, filed Sep. 11, 2003, Groen et al.
U.S. Appl. No. 10/660,016, filed Sep. 11, 2003, Jenkins.
U.S. Appl. No. 10/660,190, filed Sep. 11, 2003, Groen.
U.S. Appl. No. 10/659,916, filed Sep. 11, 2003, Black et al.
U.S. Appl. No. 10/659,978, filed Sep. 11, 2003, Groen et al.
U.S. Appl. No. 10/660,235, filed Sep. 11, 2003, Boecker et al.
U.S. Appl. No. 10/659,966, filed Sep. 11, 2003, Chuang et al.
U.S. Appl. No. 10/660,243, filed Sep. 11, 2003, Shafer et al.

* cited by examiner programmable logic device 10 programmable MGT 14 - 28 programmable transmit PMA module 38 programmable serializing data path 80 programmable clock divider 94

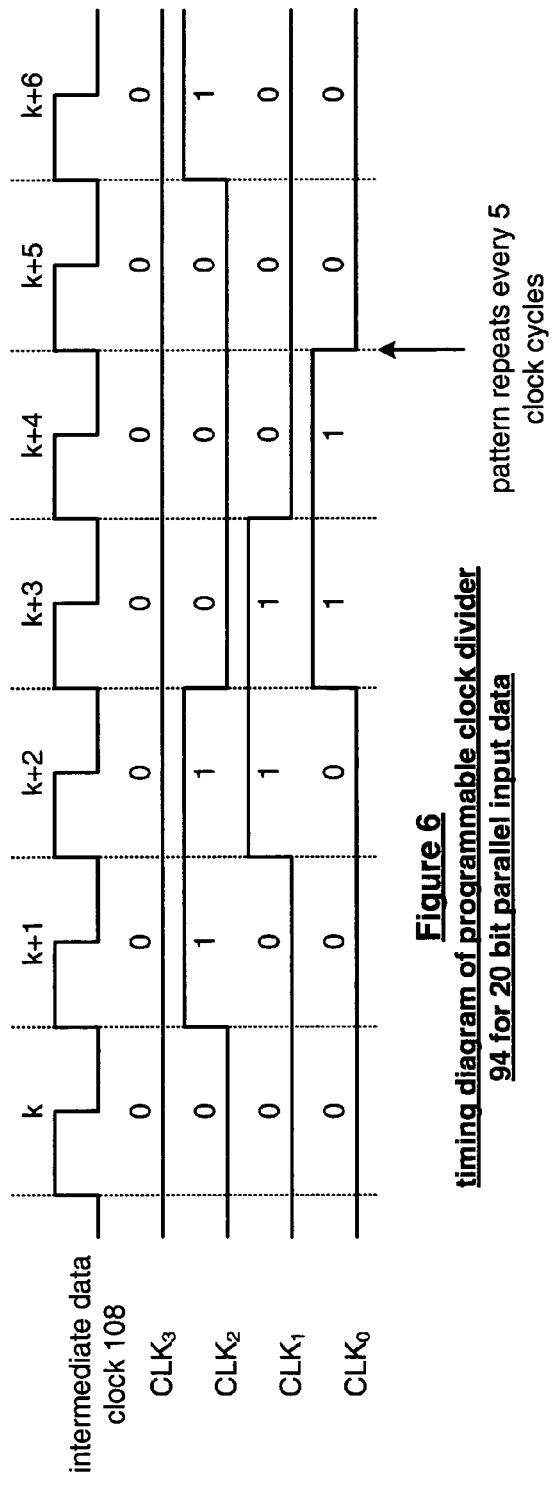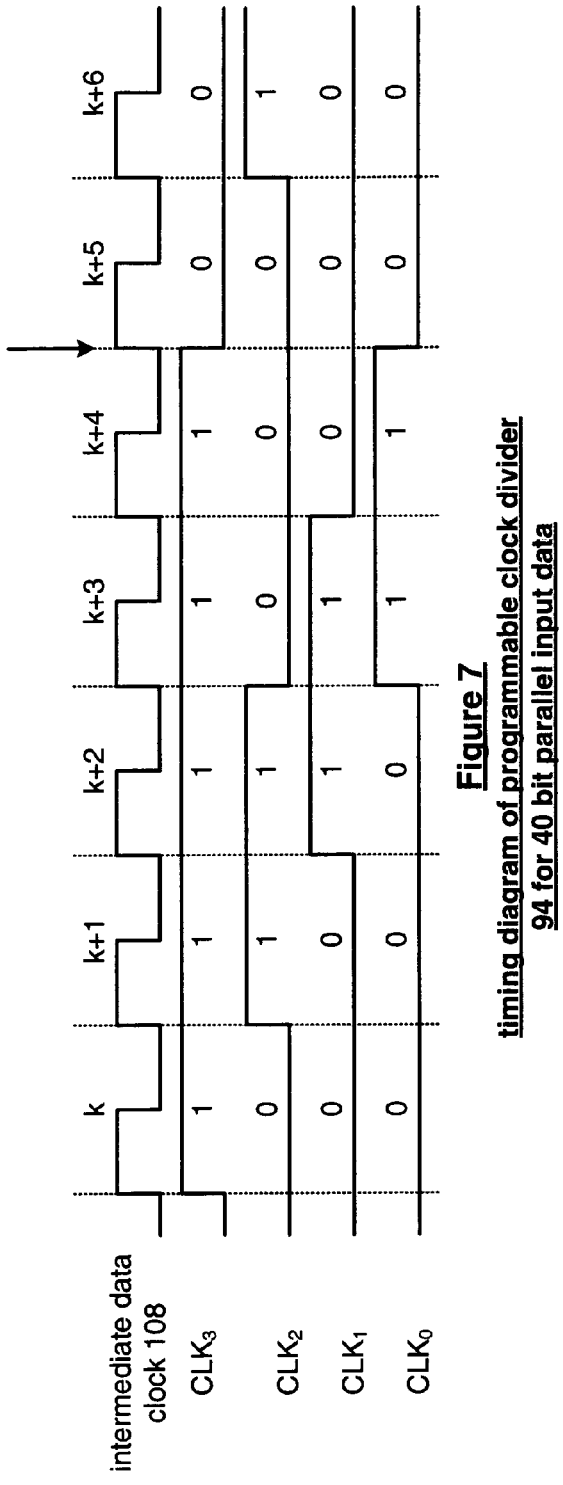
Figure 6
timing diagram of programmable clock divider 94 for 20 bit parallel input data
Figure 7
timing diagram of programmable clock divider 94 for 40 bit parallel input data

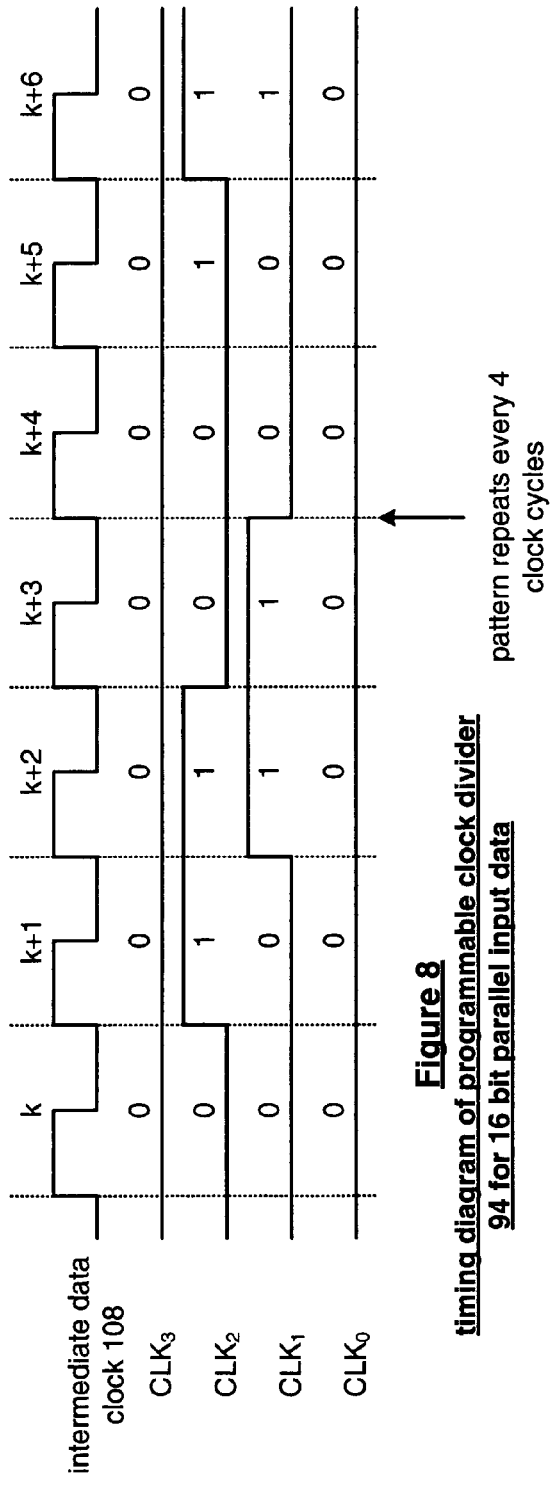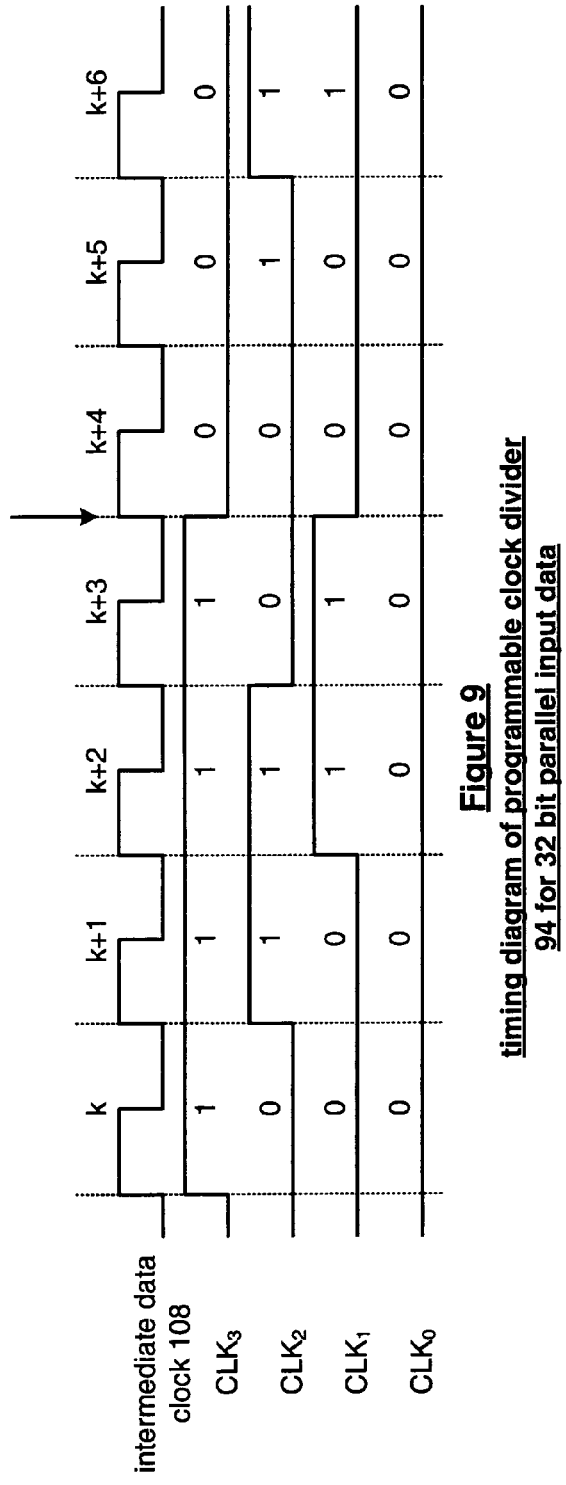
Figure 8
timing diagram of programmable clock divider 94 for 16 bit parallel input data
Figure 9
timing diagram of programmable clock divider 94 for 32 bit parallel input data parallel to serial module 84 parallel to serial module 84 parallel to serial module 84

PROGRAMMABLE SERIALIZING DATA PATH

FIELD OF THE INVENTION

This invention relates generally to general-purpose integrated circuits and more particularly to programmable logic devices.

BACKGROUND

Programmable devices are a class of general-purpose integrated circuits that can be configured for a wide variety of applications. Such programmable devices have two basic versions, mask programmable devices, which are programmed only by a manufacturer, and field programmable devices, which are programmable by the end-user. In addition, programmable devices can be further categorized as programmable memory devices or programmable logic devices. Programmable memory devices include programmable ready-only memory (PROM), erasable programmable read-only memory (EPROM) and electronically erasable programmable read-only memory (EEPROM). Programmable logic devices include programmable logic array (PLA) devices, programmable array logic (PAL) devices, erasable programmable logic devices (EPLD), and programmable gate arrays (PGA).

Field programmable gate arrays (FPGA) have become very popular for telecommunication applications, Internet applications, switching applications, routing applications, et cetera. Generally, an FPGA includes a programmable logic fabric and a programmable input/output section. The programmable logic fabric may be programmed to perform a wide variety of functions corresponding to the particular end-user applications. The programmable logic fabric may be implemented in a variety of ways. For example, the programmable logic fabric may be implemented in a systematic array configuration, a row base configuration, a sea-of-gates configuration, or a hierarchical programmable logic device configuration.

The programmable input/output section, may be fabricated on the perimeter of a substrate supporting the FPGA and provides coupling to the pins of the integrated circuit package allowing users access to the programmable logic fabric. Typically, the programmable input/output section includes a number of serial/deserial transceivers to provide access to the programmable logic fabric. Such transceivers include a receiver section that receives incoming serial data and converts it into parallel data and a transmitter section that converts outgoing parallel data into an outgoing serial data stream.

Since FPGA's are used in a wide variety of applications, which are typically governed by one or more standards, the transceivers need to be able to accommodate a wide variety of data. For example, data based standards, such as 10G Ethernet, Infiniband, Fibre Channel, have parallel input data widths in multiples of ten (e.g., 10 bits, 20 bits, 40 bits, etc.) while telecom based standards, such as SONET OC-48 and OC-192, have parallel input data widths in multiples of eight (e.g., 8 bits, 16 bits, 32 bits, 64 bits, etc.). To accommodate the different types of input parallel data, the receive path of the transceivers included two parallel to serial converters: one for each type of parallel input data. While this solutions allows the FPGA to facilitate the wide variety of applications, it is costly in die area since effectively redundant circuits are included on the die and only one is used at a time.

Therefore, a need exists for a programmable serial data path that can accommodate input parallel data of varying data width multiples.

BRIEF SUMMARY OF THE INVENTION

The programmable serializing data path of the present invention substantially meets these needs and others. In one embodiment, a programmable serial data path includes a programmable timing circuit and a parallel to serial module. The programmable timing circuit is operably coupled to generate a first plurality of timing signals when the width of the parallel input data is of a first multiple and to generate a second plurality of timing signals when the width of the parallel input data is of a second multiple. The parallel to serial module is operably coupled to convert the parallel input data into serial output data based on the first or second plurality of timing signals. With such a programmable serial data path, a wide variety of applications having input parallel data of varying data width multiples can readily be accommodated.

In another embodiment, a method for programmable serializing of parallel data begins by receiving the parallel data. The process continues by obtaining a data width of the parallel data by obtaining a desired serial data output rate. The process continues by generating a multiple state control sequence based on the data width of the parallel data and the desired serial data output rate. The process continues by converting the parallel data into serial data in accordance with the multiple state control sequence. With such a method, a wide variety of applications having input parallel data of varying data width multiples can readily be accommodated.

BRIEF DESCRIPTION OF THE DRAWINGS

FIG. 6 is a timing diagram of the programmable clock divider for 20 bit parallel input data in accordance with the present invention;

FIG. 7 is a timing diagram of the programmable clock divider for 40 bit parallel input data in accordance with the present invention;

FIG. 8 is a timing diagram of the programmable clock divider for 16 bit parallel input data in accordance with the present invention;

FIG. 9 is a timing diagram of the programmable clock divider for 32 bit parallel input data in accordance with the present invention;

DETAILED DESCRIPTION OF THE INVENTION

Figure 1:
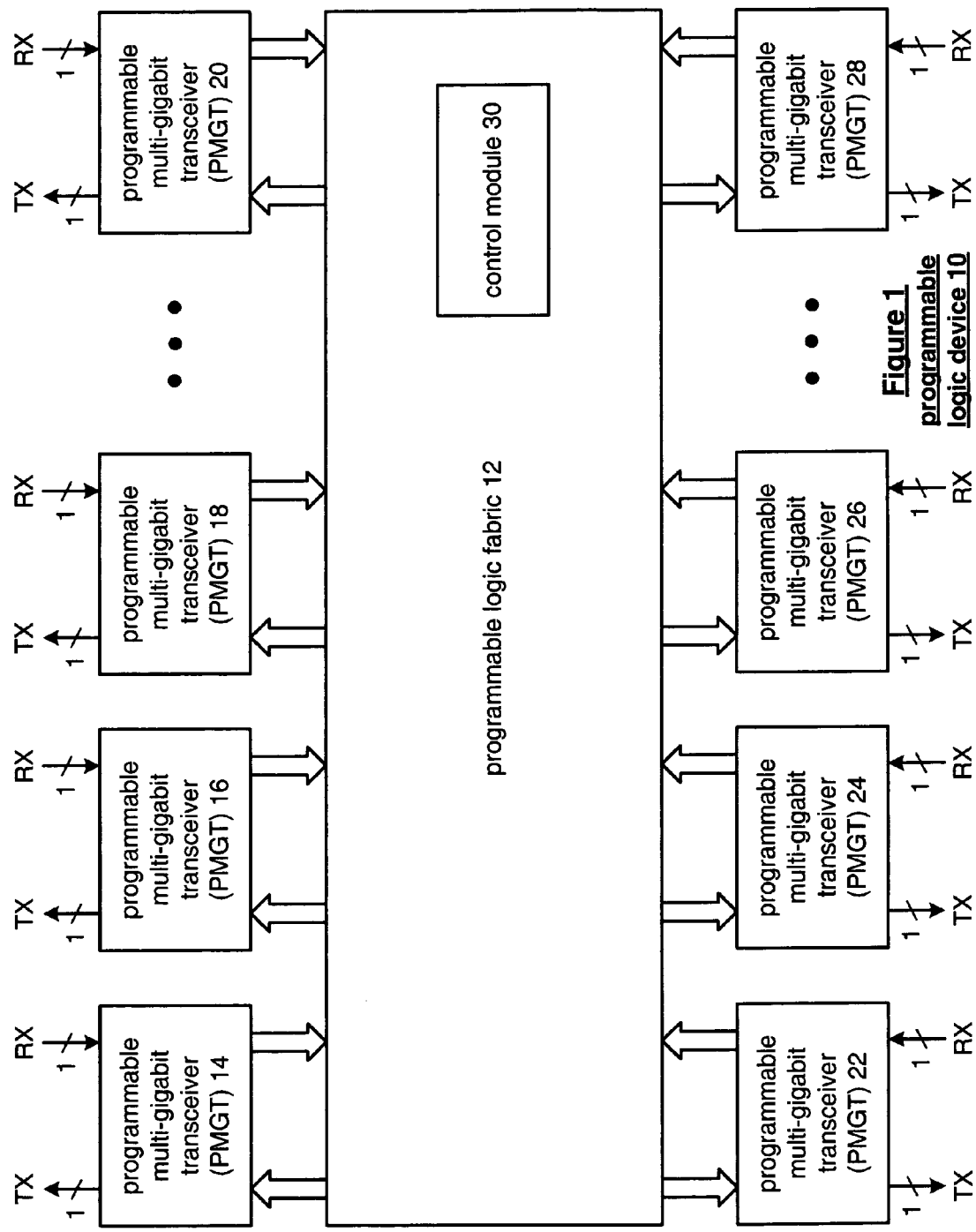
FIG. 1 is a schematic block diagram of a programmable logic device in accordance with the present invention.

FIG. 1 is a schematic block diagram of a programmable logic device 10 that includes programmable logic fabric 12, a plurality of programmable multi-gigabit transceivers (PMGT) 14–28 and a control module 30. The programmable logic device 10 may be a programmable logic array device, a programmable array logic device, an erasable programmable logic device, and/or a field programmable gate array (FPGA). When the programmable logic device 10 is a field programmable gate array (FPGA), the programmable logic fabric 12 may be implemented as a symmetric array configuration, a row-based configuration, a sea-of-gates configuration, and/or a hierarchical programmable logic device configuration. The programmable logic fabric 12 may further include at least one dedicated fixed processor, such as a microprocessor core, to further facilitate the programmable flexibility offered by a programmable logic device 10.

The control module 30 may be contained within the programmable logic fabric 12 or it may be a separate module. In either implementation, the control module 30 generates the control signals to program each of the transmit and receive sections of the programmable multi-gigabit transceivers 14–28. In general, each of the programmable multi-gigabit transceivers 14–28 performs a serial-to-parallel conversion on received data and performs a parallel-to-serial conversion on transmit data. The parallel data may be 8-bits, 10-bits, 16-bits, 20-bits, 32-bits, 40-bits, 64-bits, et cetera wide. Typically, the serial data will be a 1-bit stream of data that may be a binary level signal, multi-level signal, etc. Further, two or more programmable multi-gigabit transceivers may be bonded together to provide greater transmitting speeds. For example, if multi-gigabit transceivers 14, 16 and 18 are transceiving data at 3.125 gigabits-per-second, the transceivers 14–18 may be bonded together such that the effective serial rate is 3 times 3.125 gigabits-per-second.

Each of the programmable multi-gigabit transceivers 14–28 may be individually programmed to conform to separate standards. In addition, the transmit path and receive path of each multi-gigabit transceiver 14–28 may be separately programmed such that the transmit path of a transceiver is supporting one standard while the receive path of the same transceiver is supporting a different standard. Further, the serial rates of the transmit path and receive path may be programmed from 1 gigabit-per-second to tens of gigabits-per-second. The size of the parallel data in the transmit and receive sections, or paths, is also programmable and may vary from 8-bits, 10-bits, 16-bits, 20-bits, 32-bits, 40-bits, 64-bits, et cetera.

Figure 2:
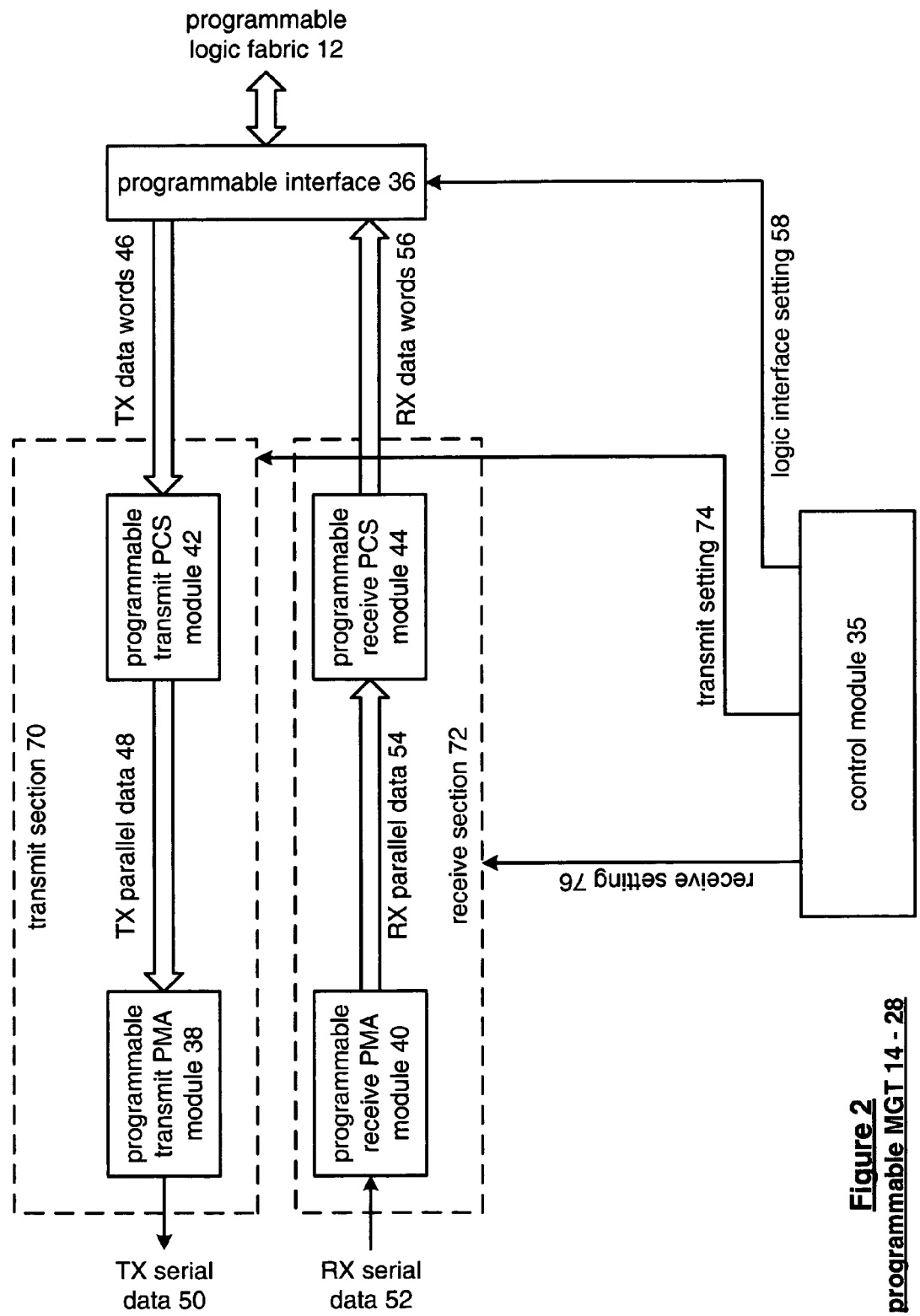
FIG. 2 is a schematic block diagram of a programmable multi-gigabit transceiver in accordance with the present invention.

FIG. 2 is a schematic block diagram of a representative one of the programmable multi-gigabit transceivers 14–28. In this embodiment, the programmable multi-gigabit transceiver 14–28 includes a transmit section 70, a receive section 72, a control module 35 and a programmable interface 36. The transmit section 70 includes a programmable transmit PMA module 38 and a programmable transmit PCS (physical coding sublayer) module 42. The receive section 72 includes a programmable receive PMA module 40 and a programmable receive PCS module 44.

In operation, the programmable logic fabric 12 provides transmit data words 46, which may be 2 bytes, 4 bytes, 8 bytes, etc. in width, to the programmable transmit PCS module 42 via the programmable interface 36. The programmable transmit PCS module 42 converts the transmit data words 46 into transmit parallel data 48, which may be 8, 10, 16, 20, 32, 40 64, etc. bits in width. The programmable transmit PMA module 38, which will be described in greater detail with reference to FIG. 3, converts the transmit parallel data into transmit serial data 50.

The programmable receive PMA module 40 is operably coupled to convert receive serial data 52 into receive parallel data 54, which may be 8, 10, 16, 20, 32, 40, 64, etc. bits in width. The programmable receive PCS module 44 converts the receive parallel data 54 into receive data words 56, which may be 2 bytes, 4 bytes, 8 bytes, etc. in width. The programmable receive PCS module 44 provides the receive data words 56 to the programmable logic fabric 12 via the programmable interface 36.

In this embodiment, the control module 35 programs the transmit section 70 and the receive section 72 via transmit setting 74 and receive setting 76, respectively. The control module 35 also programs the programmable interface 36 via the logic interface setting 58. Accordingly, the control module 35 may program the receiver section 72 to function in accordance with one standard while programming the transmit section 70 in accordance with another standard and to participate in channel bonding. Further, the logic interface setting 58 may indicate that the transmit data words 46 are received from the programmable logic fabric 12 at a different rate than the received data words 56 are provided to the programmable logic fabric 12. As one of average skill in the art will appreciate, the programmable interface 36 may include a transmit buffer and a receive buffer, and/or an elastic store buffer to facilitate the providing and receiving of the data words 56 and 46 to-and-from the programmable logic fabric 12.

Figure 3:
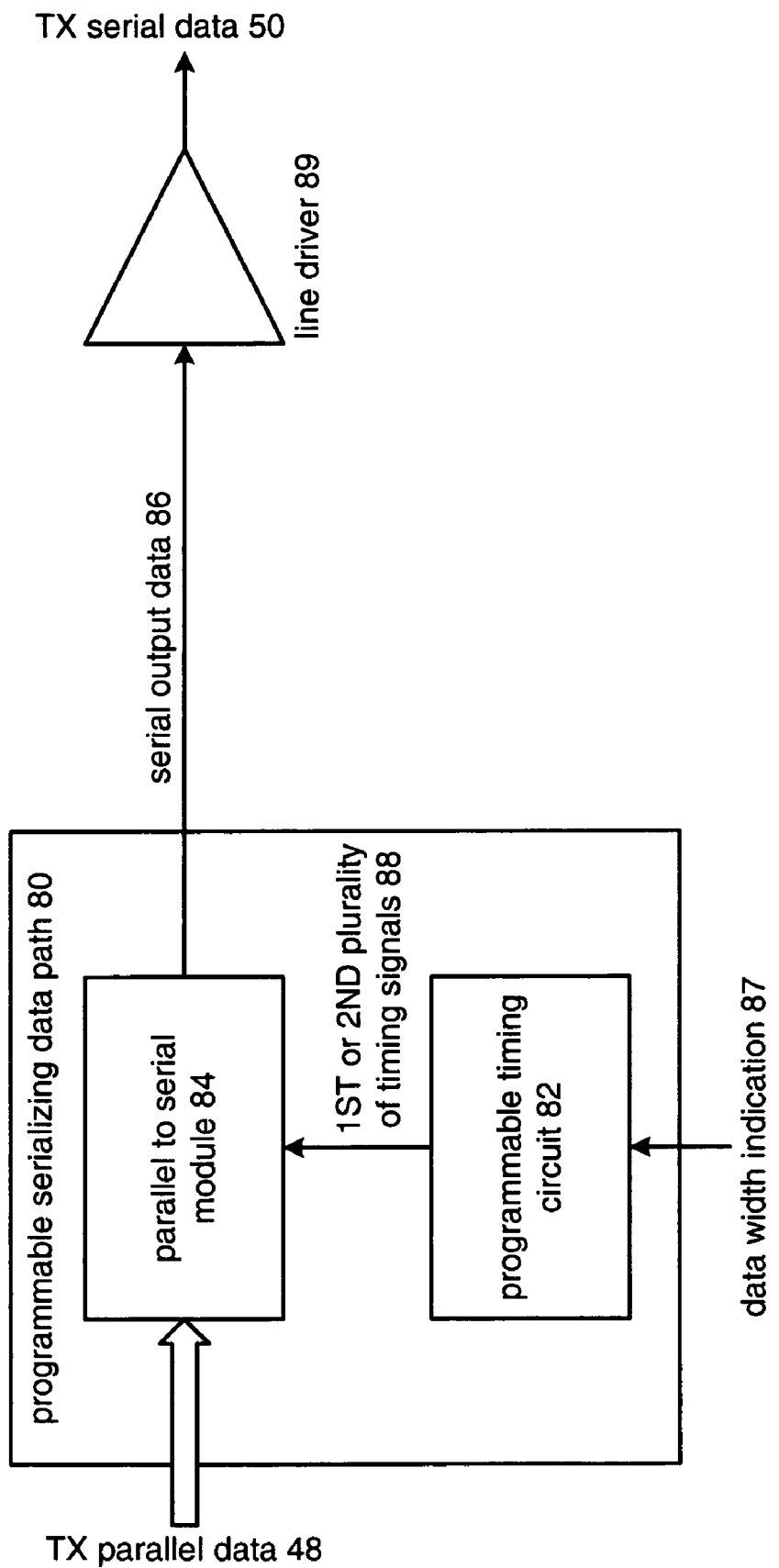
FIG. 3 is a schematic block diagram of a programmable transmit physical media attachment module in accordance with the present invention.

FIG. 3 is a schematic block diagram of the programmable transmit PMA module 38 that includes a programmable serializing data path 80 and a line driver 89. The programmable serializing data path 80 includes a programmable timing circuit 82, which will be described in greater detail with reference to FIGS. 4–9, and a parallel to serial module 84, which will be described in greater detail with reference to FIGS. 4, 10A, and 10B. In general, the programmable timing circuit 82 is operably coupled to generate a first plurality of timing signals when width 87 of parallel input data 48 is of a first multiple and to generate a second plurality of timing signals when the width 87 of the parallel input data is of a second multiple. The parallel to serial module 84 is operably coupled to convert the parallel input data 48 into serial output data 86 based on the first or second plurality of timing signals 88. The line driver 89 is operably coupled to drive the serial output data 86 onto a transmission line as the transmit serial data 50.

Figure 4:
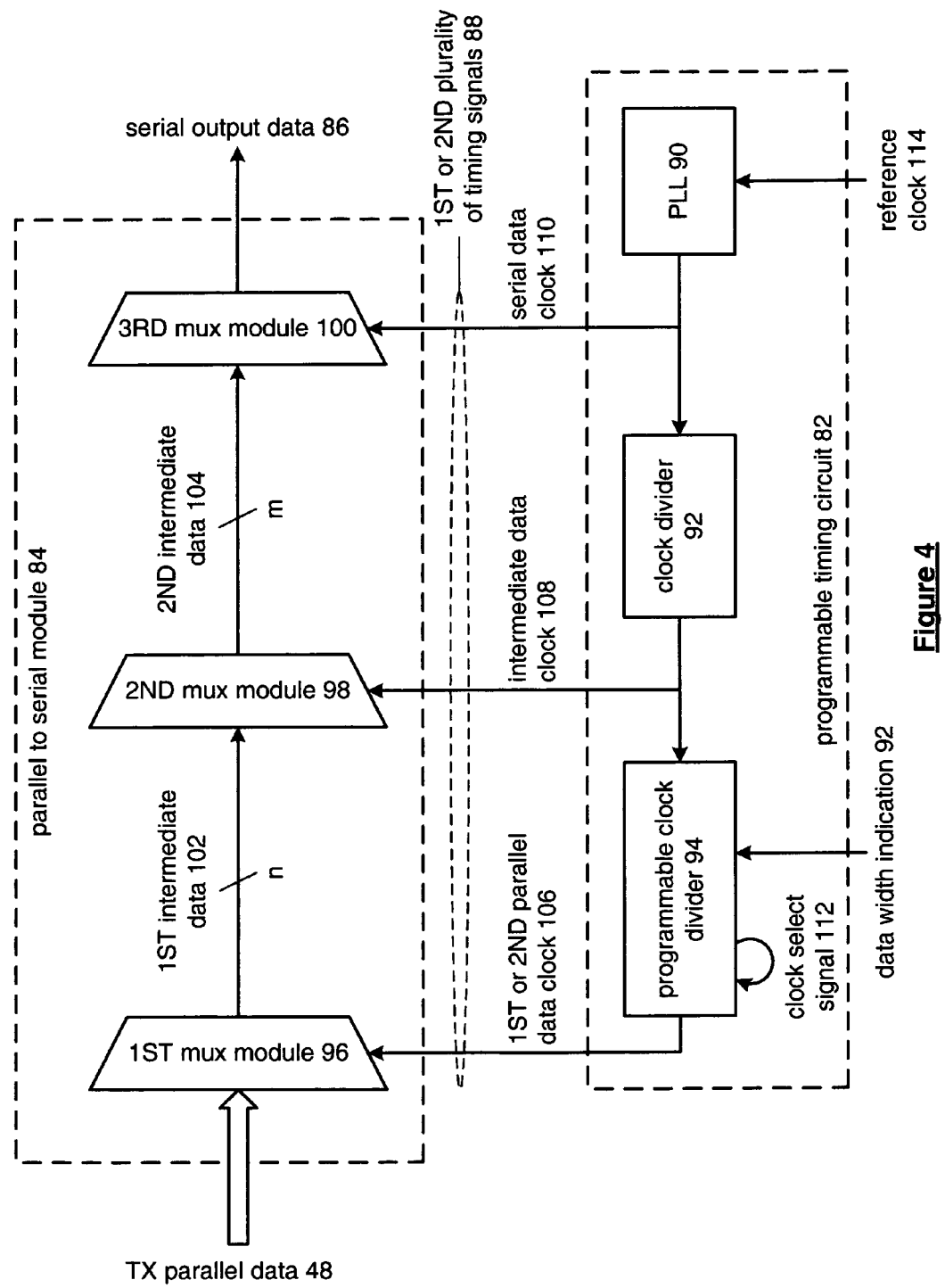
FIG. 4 is a schematic block diagram of a programmable serializing data path in accordance with the present invention.

FIG. 4 is a schematic block diagram of the programmable serializing data path 80, wherein the parallel to serial module 84 includes three multiplexing modules 96, 98, 100 and the programmable timing circuit 82 includes a phase locked loop (PLL) 90, a clock divider 92, and a programmable clock divider 94.

In operation, the PLL 90 generates a serial data clock 110 from a reference clock 114. For example, the reference clock 114 may be a 25 MHz clock and the serial data clock 110 may be a 5 GHz clock. The clock divider 92 divides the serial data clock 110 to produce an intermediate data clock 108. For example, the clock divider 92 may be a divide by two module such that, for a 5 GHz serial data clock 110, the intermediate data clock 108 is a 2.5 GHz clock.

The programmable clock divider 94, which will be described in greater detail with reference to FIGS. 5–9, receives the data width indication 92 and generates therefrom a clock select signal 112. Based on the clock select signal 112, the programmable clock divider 94 divides the intermediate data clock 108 to produce a first or second multi-bit parallel data clock 106. For example, if the data width is a first multiple (e.g., 20) the clock select signal 112 may enable the programmable clock divider 94 to be a divide by five state machine. As an alternate example, if the data width is of a second multiple (e.g., 16), the clock select signal may enable the programmable clock divider 94 to be a divide by four state machine. Note that the first parallel data clock, the intermediate data clock 108, and the serial data clock 110 comprise the first plurality of timing signals and the second parallel data clock, the intermediate data clock 108, and the serial data clock 110 comprise the second plurality of timing signals.

Figure 10:
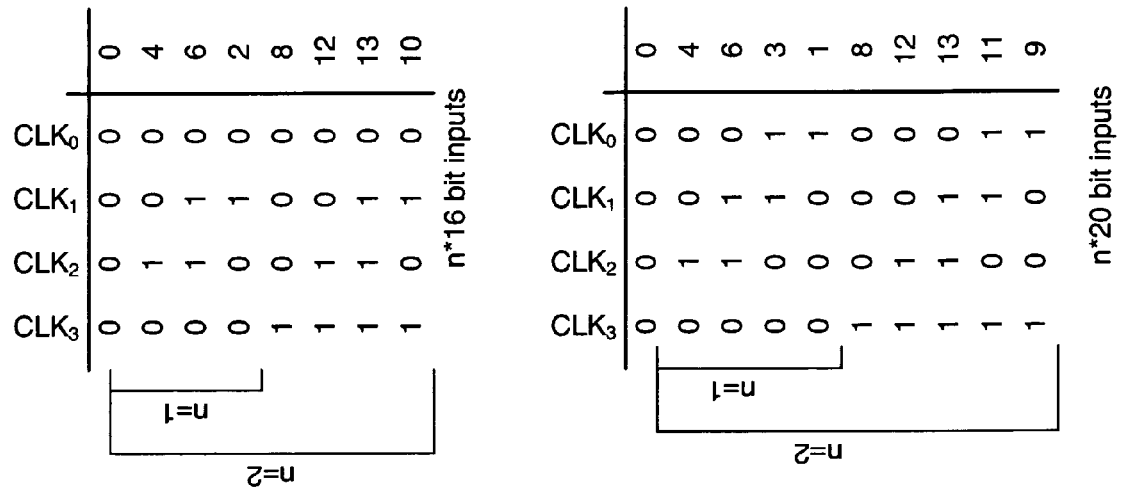
FIGS. 10A and 10B are schematic block diagrams of the parallel to serial module in accordance with the present invention.
Figure 10:
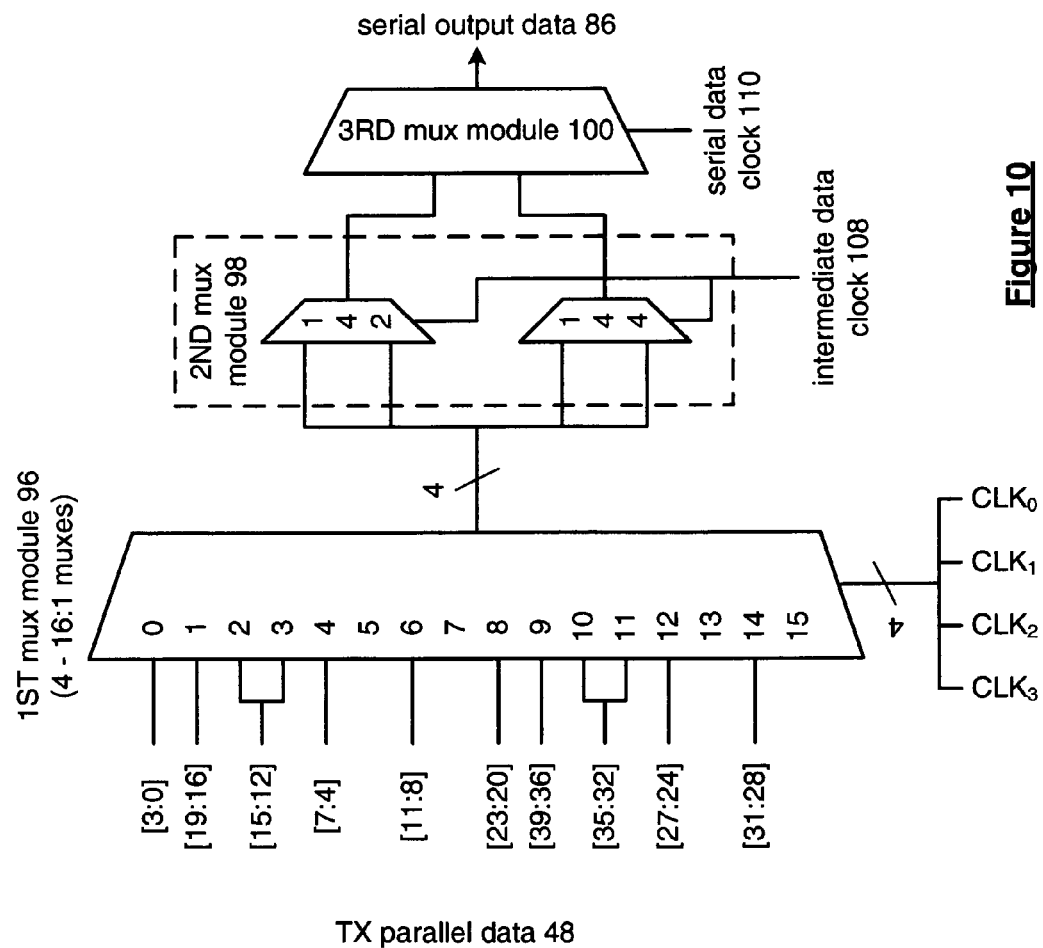
Figure 10A:
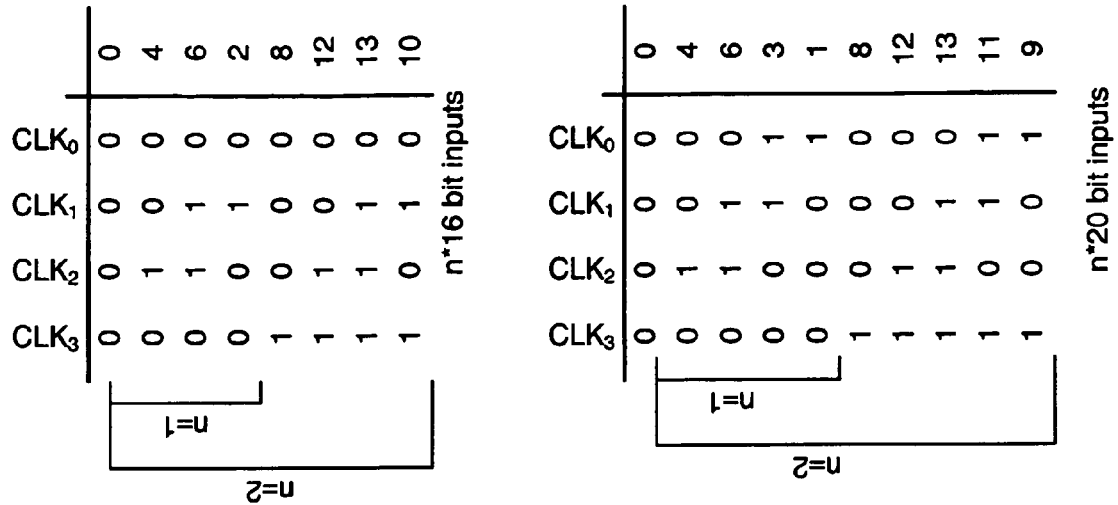
Figure 10A:
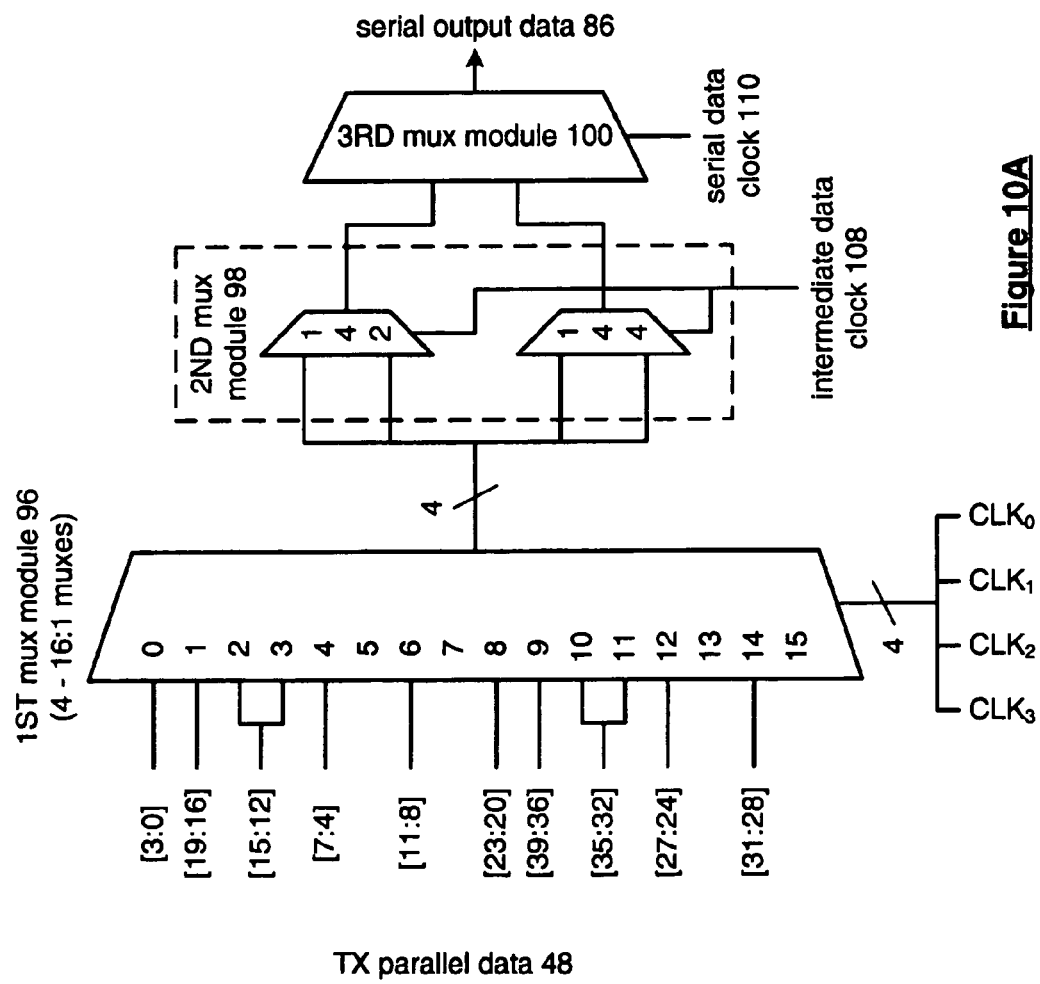
Figure 10B:
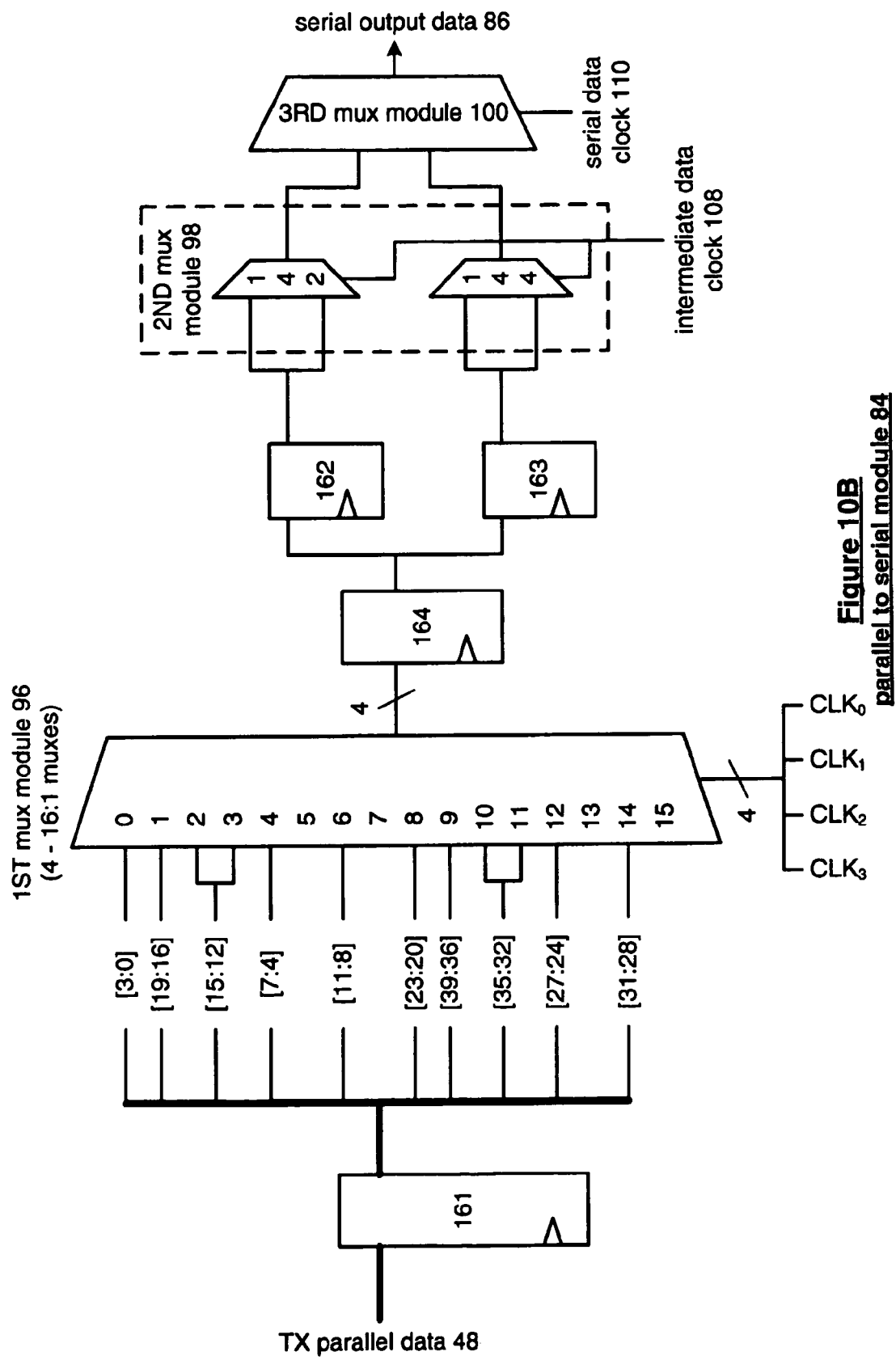

The first multiplexing module 96, which will be described in greater detail with reference to FIGS. 10A and 10B, is operably coupled to receive the transmit parallel data 48 and, based on the first or second parallel data clock 106, produce n-bit first intermediate data 102. In one embodiment, the first multiplexing module 96 includes four 16 to 1 multiplexers that collectively convert transmit parallel data into a four bit data stream.

The second multiplexing module 98 converts the first intermediate data 102 into m-bit intermediate data 104 based on the intermediate data clock 108, where m is less than n. In one embodiment, the second multiplexing module 98 includes two 2 to 1 multiplexors and the second intermediate data 104 is two bit data. The third multiplexing module 100 converts the second intermediate data 104 into the serial output data 100 based on the serial data clock 110.

As an example of 20 bit parallel input data to a 5 Gbps serial data stream, the serial data clock 110 is established to be 5 GHz. The clock divider 92 is a divide by two module such that the intermediate data clock 108 is 2.5 GHz. The clock select signal 112 establishes a divide by five operation for the programmable clock divider 94 such that the parallel data clock 106 is a three-bit, five state 250 MHz clock signal. For each state of the parallel data clock 106, the first multiplexing module 96 outputs 4 bits of the parallel data 48, which is inputted to the second multiplexing module 98. The second multiplexing module 98 outputs from one of the two 2 to 1 multiplexers at every transition of the intermediate data clock 108 to produce a 2-bit output every clock cycle of the intermediate data clock 108. The third multiplexing module 100 outputs one of the 2 bits from the second multiplexing module on every transition of the serial data clock 110 to produce the serial output data 86.

As one of average skill in the art will appreciate, a buffer or latch may be included at the input of each of the multiplexing modules 96, 98, and 100 to facilitate data and clock alignment.

Figure 5:
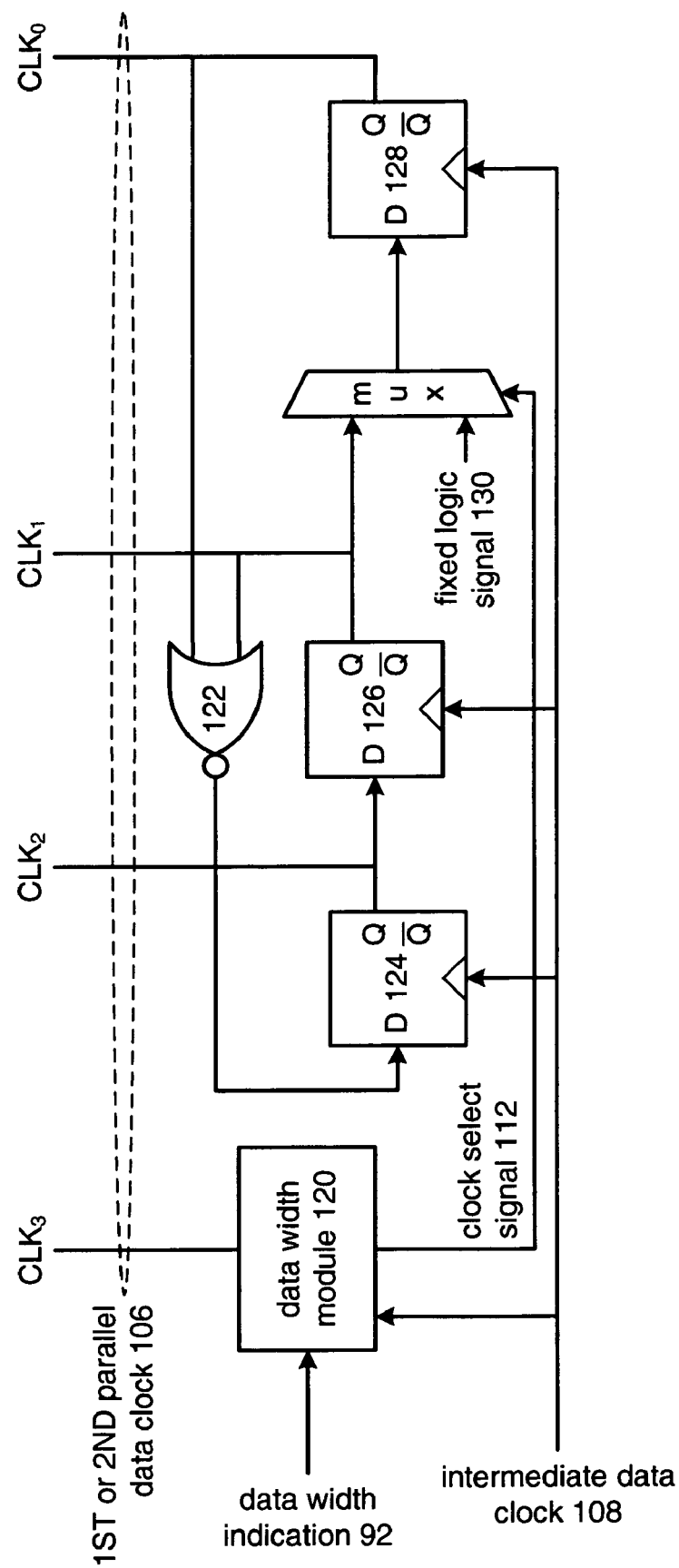
FIG. 5 is a schematic block diagram of the programmable clock divider in accordance with the present invention.

FIG. 5 is a schematic block diagram of the programmable clock divider 94 that includes a plurality of flip flops 124, 126, and 128, a data width module 120, a NOR gate 122, and a multiplexer (MUX). The data width module 120 is operably coupled to receive the data width indication 92 and generate, therefrom, the clock select signal 112, which is the control input to the multiplexer (MUX). In addition, the data width module 120 generates a clock signal ($CLK_3$) of the parallel data clock 106 based on the data width indication 92 and the intermediate data clock 108.

When the data width indication 92 indicates that the data width is 20 bits, the clock select signal 112 enables the multiplexer to pass the output of flip-flop 126 to the input of flip-flop 128. In this mode, the timing diagram of FIG. 6 is produced. As shown, at cycle k of the intermediate data clock 108, the outputs of each of the flip-flops ($CLK_2$, $CLK_1$, and $CLK_0$) are logic zero. Note that with a data width of 20 bits, the clock signal ($CLK_3$) produced by the data width module 120 is always a logic zero. With both inputs to NOR gate 122 being logic zeros, the output of the NOR gate 122 is a logic one, which is coupled to the input of the first flip flop 124.

At clock cycle k+1 of the intermediate data clock 108, the output of the first flip-flop ($CLK_2$) is a logic one, while the outputs ($CLK_1$ and $CLK_0$) of the second and third flip flops are a logic zero. At this cycle, both inputs to the NOR gate are both logic zeros, thus the output of the NOR gate 122 remains a logic one. Thus, at clock cycle k+2, the output of the first flip flop ($CLK_2$) remains a logic one. Since, at clock cycle k+1, the first flip-flop outputted a logic one, which is the input to the second flip flop 126, during clock cycle k+2, the output of the second flip flop ($CLK_1$) is a logic one. The output of the third flip flop ($CLK_0$) remains a logic zero. With one of the inputs to the NOR gate 122 being a logic one during clock cycle k+2, the output of NOR gate 122 is a logic zero. Thus, at clock cycle k+3, the input to the first flip flop is a logic zero, such that its output ($CLK_2$) is a logic zero. With both inputs to the second and third flip flops being logic ones, the outputs of these flip flops ($CLK_1$ & $CLK_0$) are both logic ones. With these signals being logic ones, the output of NOR gate 122 remains a logic zero.

At clock cycle k+4, the inputs to first and second flip flops are both logic zeros, thus their outputs ($CLK_2$ & $CLK_1$) are logic zeros. The input to the third flip flop is a logic one, thus its output ($CLK_0$) is a logic one. With one of the inputs to the NOR gate 122 being a logic one, its output is a logic zero. Thus, at clock cycle k+5, the input to each of the flip flops is zero, thus their outputs are zero, which corresponds to the first state of the five states for the parallel clock 106, and the five state pattern repeats.

FIG. 7 is a timing diagram of the programmable clock divider 94 when the data width of the input parallel data is 40 bits. The generation of $CLK_2$, $CLK_1$, and $CLK_0$ is as discussed with reference to FIG. 6. In this example, the clock signal $CLK_3$ produced by the data width module 120 is toggled at a rate corresponding to the rate at which the cycle of clocks $CLK_2$, $CLK_1$, and $CLK_0$ repeats. Accordingly, in this mode, the programmable clock divider produces a 4 bit 10 state parallel clock 106.

With reference to FIG. 5, when the data width indication 92 indicates that the data width is 16 bits, the clock select signal 112 enables the multiplexer to output the fixed logic signal 130 (e.g., a logic zero) to the input of flip-flop 128. In this mode, the timing diagram of FIG. 8 is produced. As shown in FIG. 8, at cycle k of the intermediate data clock 108, the outputs of each of the flip-flops ($CLK_2$, $CLK_1$, and $CLK_0$) are logic zero. With both inputs to NOR gate 122 being logic zeros, the output of the NOR gate 122 is a logic one, which is coupled to the input of the first flip flop 124. Note that with a data width of 16 bits, the clock signal ($CLK_3$) produced by the data width module 120 is always a logic zero. Further note that with a fixed logic zero coupled to the input of the third flip flop 128 its output ($CLK_0$) is always a logic zero.

At clock cycle k+1 of the intermediate data clock 108, the output of the first flip-flop ($CLK_2$) is a logic one, while the output ($CLK_1$) of the second third flip flop is a logic zero. At this cycle, both inputs to the NOR gate are both logic zeros, thus the output of the NOR gate 122 remains a logic one. Thus, at clock cycle k+2, the output of the first flip flop ($CLK_2$) remains a logic one. Since, at clock cycle k+1, the first flip-flop outputted a logic one, which is the input to the second flip flop 126, during clock cycle k+2, the output of the second flip flop ($CLK_1$) is a logic one. With one of the inputs to the NOR gate 122 being a logic one during clock cycle k+2, the output of NOR gate 122 is a logic zero. Thus, at clock cycle k+3, the input to the first flip flop is a logic zero, such that its output ($CLK_2$) is a logic zero. With the input to the second third flip flop being a logic one, its output ($CLK_1$) is a logic one. With these signals being logic ones, the output of NOR gate 122 remains a logic zero.

At clock cycle k+4, the inputs to first and second flip flops are both logic zeros, thus their outputs ($CLK_2$ & $CLK_1$) are logic zeros, which corresponds to the first state of the four states for the parallel clock 106, and the four state pattern repeats.

FIG. 9 is a timing diagram of the programmable clock divider 94 when the data width of the input parallel data is 32 bits. The generation of $CLK_2$, $CLK_1$, and $CLK_0$ is as discussed with reference to FIG. 8. In this example, the clock signal $CLK_3$ produced by the data width module 120 is toggled at a rate corresponding to the rate at which the cycle of clocks $CLK_2$, $CLK_1$, and $CLK_0$ repeats. Accordingly, in this mode, the programmable clock divider produces a 4 bit 8 state parallel clock 106.

FIG. 10A is a schematic block diagram of an embodiment of the parallel to serial module 84. In this embodiment, the parallel to serial module 84 includes four 16 to 1 multiplexers for the first multiplexing module 96, two 2 to 1 multiplexers 142 and 144 for the second multiplexing module 98, and one 2 to 1 multiplexer for the third multiplexing module 100. Note that the four 16 to 1 multiplexers of the first multiplexing module 96 are shown superimposed such that the zeroth bit position of the first multiplexing module 96 receives bits 0 through 3 [3:0] of the parallel data 48. In this configuration, a first one of the four 16 to 1 multiplexers receive bit 0, a second multiplexer receives bit 1, a third multiplexer receives bit 2, and the fourth multiplexer receives bit 3.

As further illustrated, the bit 1 position of the four multiplexers receives bits 16 to 19 [19:16] of the parallel data 48. The bit 2 and 3 positions of the four multiplexers receive bits 12 to 15 [15:12] of the parallel data 48. The bit 4 position of the four multiplexers receives bits 4 to 7 [7:4] of the parallel data 48. The bit 6 position of the four multiplexers receives bits 8 to 11 [11:8] of the parallel data 48. Note that bit positions 5 and 7 are unused. For 16 bit or 20 bit data 48, these are the only connections needed to produce the serial output data 86. The remaining connections to the input bit positions of the four multiplexers are for 32 bit and 40 bit parallel input data 48.

For instance, when the parallel data is 20 bits in width, the table in the lower right of the figure illustrates the multiple states of the parallel clock 106 that includes $CLK_3$, $CLK_2$, $CLK_1$, and $CLK_0$ and the corresponding decimal equivalent of the parallel clock 106. As is also shown, these clock signals are the control inputs to the four multiplexers of the first multiplexing module 96. At the first interval of the parallel clock, each of the clock signals $CLK_3$, $CLK_2$, $CLK_1$, and $CLK_0$ are zero, which has a decimal equivalent of 0. As such, with this combination of clock signals applied to the control input of the multiplexers of the first multiplexing module 96, each of the four multiplexers outputs the data coupled to bit position 0. As configured, this corresponds to outputting the first four bits [3:0] of the parallel data 48. The next state of the parallel clock is 0100, which is 4. Thus, the multiplexers output the data coupled to input bit 4 position, which corresponds to bits 4–7 of the parallel data 48. At the third interval of the parallel clock, it has a value of 0110, which is a decimal 6. Thus, during this cycle, the multiplexers output the bits [11:8] at bit 6 position of their inputs. Note that these three clock cycles are the same for the 16-bit parallel data width as shown in the clock pattern in the upper right of the figure.

At the fourth state of the parallel clock for a 20 bit input, it has a binary value of 0011, which is the decimal equivalent of 3. Thus, during this interval, for 20 bit data, the multiplexers are outputting the bits [15:12] present at bit 3 position of their inputs. Note that the fourth state of the parallel clock for a 16 bit input is 0010, which is the decimal equivalent of 2. As such, during the fourth interval of the parallel clock for 16 bit inputs, the multiplexers output the bits [15:12] at bit 2 position of their inputs. Since the parallel clock is either in a 20 bit, or multiple thereof, mode, or a 16 bit, or multiple thereof, mode, the second and third inputs of the multiplexers can be tied together without incident.

Following the remaining states for 16 bit, 20 bit, 32 bit, or 40 bit, the output of the four multiplexers can be readily determined for each state. As one of average skill in the art will appreciate, other bit widths may be converted into serial data using the concepts as presented herein.

FIG. 10B is a schematic block diagram of an embodiment of the parallel to serial module 84. This embodiment is similar to the embodiment shown in FIG. 10A with the addition of input latches 161,162, and 163 at the inputs to multiplexing modules 96,142, and 144, respectively, and output latch 164 at the output of multiplexing module 96. These latches may be used to temporarily store data.

Another embodiment of the programmable serializing data path 80 includes a processing module and memory. The processing module may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory storing the corresponding operational instructions may be embedded within, or external to, the circuitry comprising the state machine, analog circuitry, digital circuitry, and/or logic circuitry. The memory stores, and the processing module executes, operational instructions corresponding to at least some of the steps and/or functions illustrated in FIG. 11.

Figure 11:
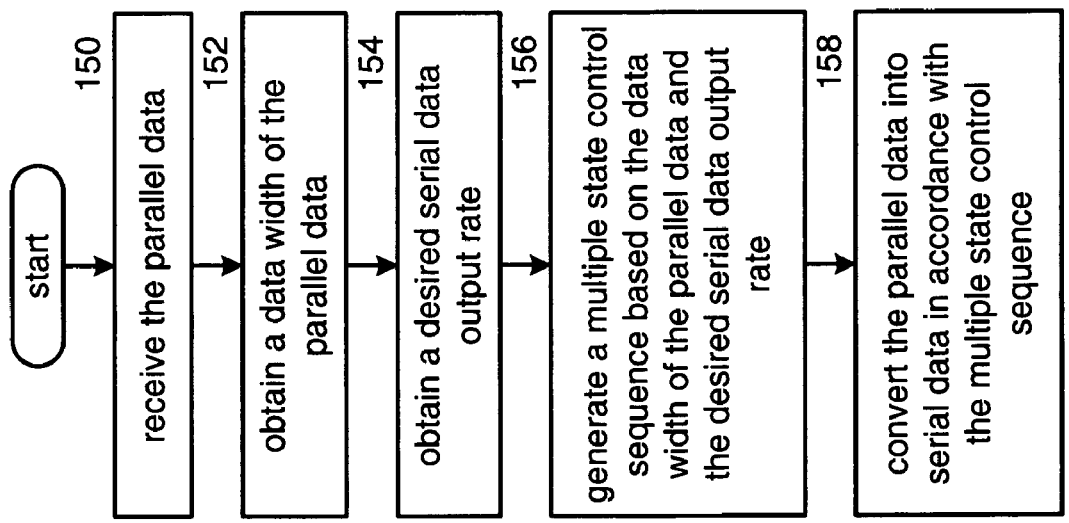
FIG. 11 is a logic diagram of a method for programmable serializing of parallel data in accordance with the present invention.

FIG. 11 is a logic diagram of a method for programmable serializing of parallel data that begins at step 150 where parallel data is received. The process then proceeds to step 152 where data width of the parallel data is obtained by receiving an input selection of the data width or by automatically determining the data width based on the receiving of the parallel data. The process then proceeds to step 154 where a desired serial data output rate is obtained.

The process then proceeds to step 156 where a multiple state control sequence is generated based on the data width of the parallel data and the desired serial data output rate. In one embodiment, multiple state control sequence is produced by first generating a serial data clock having a rate corresponding to the desired serial data output rate. Then, a first set of control signals is generated from the serial data clock when the data width is of a first multiple, wherein the serial data clock and the first set of control signals constitutes the multiple state control sequence. Alternatively, when the data width is of a second multiple, a second set of control signals is generated from the serial data clock, wherein the serial data clock and the second set of control signals constitutes the multiple state control sequence.

In another embodiment, the multiple state control sequence may be generated by: generating a serial data clock having a rate corresponding to the desired serial data output rate; dividing the serial data clock into an intermediate data clock; generating a first set of control signals from the intermediate data clock when the data width is of a first multiple, wherein the serial data clock, the intermediate data clock, and the first set of control signals constitutes the multiple state control sequence; and generating a second set of control signals from the intermediate data clock when the data width is of a second multiple, wherein the serial data clock, the intermediate data clock, and the second set of control signals constitutes the multiple state control sequence.

In this embodiment of the multiple state control sequence, the first and second set of control signals may be: a three bit, five state parallel data clock as the first set of control signals when the parallel input data is twenty bits wide; a three bit, four state parallel data clock as the second set of control signals when the parallel input data is sixteen bits wide; a four bit, ten state parallel data clock as the first set of control signals when the parallel input data is forty bits wide; and a four bit, eight state parallel data clock as the second set of control signals when the parallel input data is thirty-two bits wide.

Having generated the multiple state control sequence, the process proceeds to step 158 where the parallel data is converted into serial data in accordance with the multiple state control sequence. In one embodiment, the converting the parallel data into serial data includes, when the width of the parallel data is twenty: selecting bits of the parallel data per sequencing of the three bit, five state parallel data clock to produce a first set of intermediate bits; selecting two bits of the first set of intermediate bits per cycle of the intermediate data clock to produce two selected bits; and selecting one of the two selected bits per cycle of the serial data clock to produce the serial data.

In another embodiment, the converting the parallel data into serial data includes, when the width of the parallel data is sixteen: selecting bits of the parallel data per sequencing of the three bit, four state parallel data clock to produce a second set of intermediate bits; selecting two bits of the second set of intermediate bits per cycle of the intermediate data clock to produce the two selected bits; and selecting one of the two selected bits per cycle of the serial data clock to produce the serial data.

As one of average skill in the art will appreciate, the term "substantially", as may be used herein, provides an industry-accepted tolerance to its corresponding term. Such an industry-accepted tolerance may range, for example, from less than one percent to twenty percent and may correspond to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled".

The preceding discussion has presented a programmable serializing data path that can accommodate a wide variety of applications having input parallel data of varying data width multiples without the need for redundant circuitry. As one of average skill in the art will appreciate, other embodiments may be derived from the teachings of the present invention without deviating from the scope of the claims.

What is claimed is:

1. A programmable serializing data path comprises:
   programmable timing circuit operably coupled to generate a first plurality of timing signals when the width of parallel input data is of a first multiple and to generate a second plurality of timing signals when the width of the parallel input data is of a second multiple; and
   parallel to serial module operably coupled to convert the parallel input data into serial output data based on the first or second plurality of timing signals.

2. The programmable serializing data path of claim 1, wherein the programmable timing circuit further comprises:
   a phase locked loop operably coupled to generate a serial data clock from a reference clock;
   a clock divider module operably coupled to divide the serial data clock into an intermediate data clock; and
   programmable clock divider module operably coupled to divide the intermediate data clock into a first parallel data clock when a clock select signal is in a first state and to divide the intermediate data clock into a second parallel data clock when the clock select signal is in a second state, wherein the clock select signal is in the first state when the width of parallel input data is of the first multiple and is in the second state when the width of the parallel input data is of the second multiple, wherein the first plurality of timing signals includes the serial data clock, the intermediate data clock, and the first parallel data clock, and wherein the second plurality of timing signals includes the serial data clock, the intermediate data clock, and the second parallel data clock.

3. The programmable serializing data path of claim 2, wherein the programmable clock divider module further comprises:
   a first flip-flop having an input, an output, and a clock input;
   a second flip-flop having an input, an output, and a clock input, wherein the input of the second flip-flop is coupled to the output of the first flip-flop;
   a third flip-flop having an input, an output, and a clock input, wherein the clock inputs of the first, second, and third flip-flops are operably coupled to receive the intermediate data clock;
   a multiplexer having a first input, a second input, an output, and a control input, wherein the control input is operably coupled to receive the clock select signal, the first input of the multiplexer is operably coupled to receive a fixed logic signal, the second input of the multiplexer is operably coupled to the output of the second flip-flop, and the output of the multiplexer is operably coupled to the input of the third flip-flop; and
   a NOR gate having a first input, a second input, and an output, wherein the first input of the NOR gate is operably coupled to the output of the second flip-flop, the second input of the NOR gate is operably coupled to the output of the third flip-flop, and the output of the NOR gate is operably coupled to the input of the first flip-flop, wherein the outputs of the first, second, and third flip-flops provide the first or second parallel data clock.

4. The programmable serializing data path of claim 3, wherein the parallel to serial module further comprises:
   first multiplexing module operably coupled to convert the parallel input data into first intermediate data based on the first or second parallel data clock;
   second multiplexing module operably coupled to convert the first intermediate data into second intermediate data based on the intermediate data clock; and
   third multiplexing module operably coupled to convert the second intermediate data into the serial output data based on the serial data clock.

5. The programmable serializing data path of claim 4, wherein the first multiplexing module comprises:
   a plurality of multiplexers, wherein each of the plurality of multiplexers includes a multi-bit input, a single-bit output, and a multi-bit control input, wherein the multi-bit control input is operably coupled to receive the first or second parallel data clock, wherein the parallel input data is divided into sections, where a number of bits in each of the sections of the parallel input data corresponds to a number of multiplexers in the plurality of multiplexers, wherein the multi-bit input of each of the plurality of multiplexers is operably coupled to receive a corresponding bit from each of the sections of the parallel input data, and wherein each of the plurality of multiplexers outputs, via the single-bit output, one of the corresponding bits of one of the sections of the parallel input data at each state transition of the first or second parallel data clock.

6. The programmable serializing data path of claim 5, wherein the second multiplexing module comprises:
   a first multiplexer having a multi-bit input, a single-bit output, and a control input, wherein the multi-bit input of the first multiplexer is operably coupled to receive outputs of a first set of the plurality of multiplexers, wherein the control input of the first multiplexer is operably coupled to receive the intermediate data clock, and wherein the first multiplexer outputs, via the single-bit output of the first multiplexer, a corresponding one of the outputs of the first set of the plurality of multiplexers based on the intermediate data clock; and
   a second multiplexer having a multi-bit input, a single-bit output, and a control input, wherein the multi-bit input of the second multiplexer is operably coupled to receive outputs of a second set of the plurality of multiplexers, wherein the control input of the second multiplexer is operably coupled to receive the intermediate data clock, and wherein the second multiplexer outputs, via the single-bit output of the second multiplexer, a corresponding one of the outputs of the second set of the plurality of multiplexers based on the intermediate data clock.

7. The programmable serializing data path of claim 6, wherein the parallel to serial module further comprises:
   a first input latch operably coupled to temporarily store the parallel input data and to provide the parallel input data to the plurality of multiplexers in a synchronized manner;
   an output latch operably coupled to temporarily store the outputs of the plurality of multiplexers;
   a second input latch operably coupled to the output latch and to temporarily store the outputs of the first set of the plurality of multiplexers, wherein the second input latch provides the outputs of the first set of the plurality of multiplexers to the first multiplexer in the synchronized manner; and
   a third input latch operably coupled to the output latch and to temporarily store the outputs of the second set of the plurality of multiplexers, wherein the third input latch provides the outputs of the second set of the plurality of multiplexers to the second multiplexer in the synchronized manner.

8. The programmable serializing data path of claim 5, wherein the programmable timing circuit further functions to generate:
   a three bit, five state parallel data clock as the first parallel data clock when the parallel input data is twenty bits wide;
   a three bit, four state parallel data clock as the second parallel data clock when the parallel input data is sixteen bits wide;
   a four bit, ten state parallel data clock as the first parallel data clock when the parallel input data is forty bits wide; and
   a four bit, eight state parallel data clock as the second parallel data clock when the parallel input data is thirty-two bits wide.

9. A programmable logic device comprises:
   a transmit physical media attachment module operably coupled to convert parallel input data into serial output data;
   a receive physical media attachment module operably coupled to convert receive serial data into receive parallel data;
   a transmit physical coding sublayer module operably coupled to convert transmit data words into the parallel input data;
   a receive physical coding sublayer module operably coupled to convert the receive parallel data into receive data words; and
   programmable logic fabric operably coupled to provide the transmit data words to the transmit physical coding sublayer module to receive the receive data words from the receive physical coding sublayer module, wherein the transmit physical media attachment module includes:
      a programmable serializing data path operably coupled to convert the parallel input data into the serial output data; and
      a line driver operably coupled to drive the serial output data onto a transmission line coupled to the programmable logic device, wherein the programmable serializing data path includes:
         programmable timing circuit operably coupled to generate a first plurality of timing signals when the width of parallel input data is of a first multiple and to generate a second plurality of timing signals when the width of the parallel input data is of a second multiple; and
         parallel to serial module operably coupled to convert the parallel input data into serial output data based on the first or second plurality of timing signals.

10. The programmable logic device of claim 9, wherein the programmable timing circuit further comprises:
   a phase locked loop operably coupled to generate a serial data clock from a reference clock;
   a clock divider module operably coupled to divide the serial data clock into an intermediate data clock; and
   programmable clock divider module operably coupled to divide the intermediate data clock into a first parallel data clock when a clock select signal is in a first state and to divide the intermediate data clock into a second parallel data clock when the clock select signal is in a second state, wherein the clock select signal is in the first state when width of parallel input data is of the first multiple and is in the second state when the width of the parallel input data is of the second multiple, wherein the first plurality of timing signals includes the serial data clock, the intermediate data clock, and the first parallel data clock, and wherein the second plurality of timing signals includes the serial data clock, the intermediate data clock, and the second parallel data clock.

11. The programmable logic device of claim 10, wherein the programmable clock divider module further comprises:
a first flip-flop having an input, an output, and a clock input;
a second flip-flop having an input, an output, and a clock input, wherein the input of the second flip-flop is coupled to the output of the first flip-flop;
a third flip-flop having an input, an output, and a clock input, wherein the clock inputs of the first, second, and third flip-flops are operably coupled to receive the intermediate data clock;
a multiplexer having a first input, a second input, an output, and a control input, wherein the control input is operably coupled to receive the clock select signal, the first input of the multiplexer is operably coupled to receive a fixed logic signal, the second input of the multiplexer is operably coupled to the output of the second flip-flop, and the output of the multiplexer is operably coupled to the input of the third flip-flop; and
a NOR gate having a first input, a second input, and an output, wherein the first input of the NOR gate is operably coupled to the output of the second flip-flop, the second input of the NOR gate is operably coupled to the output of the third flip-flop, and the output of the NOR gate is operably coupled to the input of the first flip-flop, wherein the outputs of the first, second, and third flip-flops provide the first or second parallel data clock.

12. The programmable logic device of claim 11, wherein the parallel to serial module further comprises:
first multiplexing module operably coupled to convert the parallel input data into first intermediate data based on the first or second parallel data clock;
second multiplexing module operably coupled to convert the first intermediate data into second intermediate data based on the intermediate data clock; and
third multiplexing module operably coupled to convert the second intermediate data into the serial output data based on the serial data clock.

13. The programmable logic device of claim 12, wherein the first multiplexing module comprises:
a plurality of multiplexers, wherein each of the plurality of multiplexers includes a multi-bit input, a single-bit output, and a multi-bit control input, wherein the multi-bit control input is operably coupled to receive the first or second parallel data clock, wherein the parallel input data is divided into sections, where a number of bits in each of the sections of the parallel input data corresponds to a number of multiplexers in the plurality of multiplexers, wherein the multi-bit input of each of the plurality of multiplexers is operably coupled to receive a corresponding bit from each of the sections of the parallel input data, and wherein each of the plurality of multiplexers outputs, via the single-bit output, one of the corresponding bits of one of the sections of the parallel input data at each state transition of the first or second parallel data clock.

14. The programmable logic device of claim 13, wherein the second multiplexing module comprises:
a first multiplexer having a multi-bit input, a single-bit output, and a control input, wherein the multi-bit input of the first multiplexer is operably coupled to receive outputs of a first set of the plurality of multiplexers, wherein the control input of the first multiplexer is operably coupled to receive the intermediate data clock, and wherein the first multiplexer outputs, via the single-bit output of the first multiplexer, a corresponding one of the outputs of the first set of the plurality of multiplexers based on the intermediate data clock; and
a second multiplexer having a multi-bit input, a single-bit output, and a control input, wherein the multi-bit input of the second multiplexer is operably coupled to receive outputs of a second set of the plurality of multiplexers, wherein the control input of the second multiplexer is operably coupled to receive the intermediate data clock, and wherein the second multiplexer outputs, via the single-bit output of the second multiplexer, a corresponding one of the outputs of the second set of the plurality of multiplexers based on the intermediate data clock.

15. The programmable logic device of claim 14, wherein the parallel to serial module further comprises:
a first input latch operably coupled to temporarily store the parallel input data and to provide the parallel input data to the plurality of multiplexers in a synchronized manner;
an output latch operably coupled to temporarily store the outputs of the plurality of multiplexers;
a second input latch operably coupled to the output latch and to temporarily store the outputs of the first set of the plurality of multiplexers, wherein the second input latch provides the outputs of the first set of the plurality of multiplexers to the first multiplexer in the synchronized manner; and a third input latch operably coupled to the output latch and to temporarily store the outputs of the second set of the plurality of multiplexers, wherein the third input latch provides the outputs of the second set of the plurality of multiplexers to the second multiplexer in the synchronized manner.

16. The programmable logic device of claim 13, wherein the programmable timing circuit further functions to generate:
a three bit, five state parallel data clock as the first parallel data clock when the parallel input data is twenty bits wide;
a three bit, four state parallel data clock as the second parallel data clock when the parallel input data is sixteen bits wide;
a four bit, ten state parallel data clock as the first parallel data clock when the parallel input data is forty bits wide; and
a four bit, eight state parallel data clock as the second parallel data clock when the parallel input data is thirty-two bits wide.

17. A programmable timing circuit comprises:
a phase locked loop operably coupled to generate a serial data clock from a reference clock; and
a programmable clock divider module operably coupled to divide the serial data clock into a first parallel data clock when a clock select signal is in a first state and to divide the serial data clock into a second parallel data clock when the clock select signal is in a second state, wherein the first state of the clock select signal corresponds to a first multiple of states of the first parallel data clock and wherein the second state of the clock select signal corresponds to a second multiple of states of the second parallel data clock;

wherein the first state of the clock select signal further corresponds to the width of parallel input data being of a first multiple and wherein the second state of the clock select signal further corresponds to the width of the parallel input data being of a second multiple.

18. The programmable timing circuit of claim 17, wherein the programmable clock divider module further comprises:
    a clock divider module operably coupled to divide the serial data clock into an intermediate data clock, wherein the intermediate clock is used to produce the first or the second parallel data clock.

19. The programmable timing circuit of claim 18, wherein the programmable clock divider module further comprises:
    a first flip-flop having an input, an output, and a clock input;
    a second flip-flop having an input, an output, and a clock input, wherein the input of the second flip-flop is coupled to the output of the first flip-flop;
    a third flip-flop having an input, an output, and a clock input, wherein the clock inputs of the first, second, and third flip-flops are operably coupled to receive the intermediate data clock;
    a multiplexer having a first input, a second input, an output, and a control input, wherein the control input is operably coupled to receive the clock select signal, the first input of the multiplexer is operably coupled to receive a fixed logic signal, the second input of the multiplexer is operably coupled to the output of the second flip-flop, and the output of the multiplexer is operably coupled to the input of the third flip-flop; and
    a NOR gate having a first input, a second input, and an output, wherein the first input of the NOR gate is operably coupled to the output of the second flip-flop, the second input of the NOR gate is operably coupled to the output of the third flip-flop, and the output of the NOR gate is operably coupled to the input of the first flip-flop, wherein the outputs of the first, second, and third flip-flops provide the first or second parallel data clock.

* * * * *

Disclaimer

7,015,838 B1 - Eric D. Groen, Ankeny, IA (US); Charles W. Boecker, Ames, IA (US). PROGRAMMABLE SERIALIZING DATA PATH. Patent dated March 21, 2006. Disclaimer filed December 10, 2021, by the assignee, Xilinx, Inc. and Xilinx Asia Pacific PTE, LTD.

I hereby disclaim the following complete claim 1 of said patent.

*(Official Gazette, September 6, 2022)*